(12) United States Patent
Lin et al.

(10) Patent No.: US 10,950,530 B2
(45) Date of Patent: Mar. 16, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Cheng-Nan Lin, Kaohsiung (TW); Jen-Chieh Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/416,043

(22) Filed: May 17, 2019

(65) Prior Publication Data

US 2020/0365499 A1   Nov. 19, 2020

(51) Int. Cl.
*H01L 21/48*   (2006.01)
*H01L 23/498*  (2006.01)
*H01L 23/66*   (2006.01)
*H01Q 1/22*    (2006.01)

(52) U.S. Cl.
CPC .... *H01L 23/49816* (2013.01); *H01L 21/4846* (2013.01); *H01L 23/49833* (2013.01); *H01L 23/66* (2013.01); *H01Q 1/2283* (2013.01); H01L 2223/6677 (2013.01)

(58) Field of Classification Search
CPC ......... H01L 23/49816; H01L 23/49833; H01L 21/4846; H01L 2223/6677; H01L 23/66; H01Q 1/2283
USPC ........................................................ 257/737
See application file for complete search history.

(56) References Cited

U.S. PATENT DOCUMENTS

| | | | | |
|---|---|---|---|---|
| 2005/0104685 A1* | 5/2005 | Kuroki | ................. | H03H 9/725 333/133 |
| 2006/0175702 A1* | 8/2006 | Ishibashi | ............... | H01L 25/105 257/738 |
| 2009/0008765 A1* | 1/2009 | Yamano | .............. | H01L 23/3114 257/690 |
| 2016/0172317 A1* | 6/2016 | Tsai | ........................ | H01L 24/73 257/428 |

(Continued)

*Primary Examiner* — Tong-Ho Kim
(74) *Attorney, Agent, or Firm* — Foley & Lardner LLP

(57) ABSTRACT

A semiconductor device package includes a first substrate, a second substrate, a first support element, a second support element and an electronic component. The first substrate has a first surface and a second surface opposite to the first surface. The first substrate has a conductive pad adjacent to the first surface of the first substrate. The second substrate is disposed over the first surface of the first substrate. The first support element is disposed between the first substrate and the second substrate. The first support element is disposed adjacent to an edge of the first surface of the first substrate. The second support element is disposed between the first substrate and the second substrate. The second support element is disposed far away from the edge of the first surface of the first substrate. The electronic component is disposed on the second surface of the first substrate. A projection line of a contact point between the second support element and the conductive pad on the second surface of the first substrate is physically spaced apart from a projection line of a lateral surface of the electronic component on the second surface of the first substrate.

32 Claims, 12 Drawing Sheets

(56) References Cited

U.S. PATENT DOCUMENTS

2016/0263709 A1* 9/2016 Cheng ............... H01L 23/49866
2017/0125895 A1 5/2017 Baks et al.

* cited by examiner

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same, and to a semiconductor device package including two substrates to define a cavity and a method of manufacturing the same.

2. Description of the Related Art

The development of mobile communication has caused demand for high data rates and stable communication quality, and high frequency wireless transmission (e.g., 28 GHz or 60 GHz) has become one of the most important topics in the mobile communication industry. In order to achieve such high frequency wireless transmission, the signal can be transmitted in a band having wavelengths from about ten to about one millimeter ("millimeter wave," or "mmWave"). However, the signal attenuation is one of the problems in millimeter wave transmission.

SUMMARY

In one or more embodiments, a semiconductor device package includes a first substrate, a second substrate, a first support element, a second support element and an electronic component. The first substrate has a first surface and a second surface opposite to the first surface. The first substrate has a conductive pad adjacent to the first surface of the first substrate. The second substrate is disposed over the first surface of the first substrate. The first support element is disposed between the first substrate and the second substrate. The first support element is disposed adjacent to an edge of the first surface of the first substrate. The second support element is disposed between the first substrate and the second substrate. The second support element is disposed far away from the edge of the first surface of the first substrate. The electronic component is disposed on the second surface of the first substrate. A projection line of a contact point between the second support element and the conductive pad on the second surface of the first substrate is physically spaced apart from a projection line of a lateral surface of the electronic component on the second surface of the first substrate.

In one or more embodiments, a semiconductor device package includes a first substrate, a second substrate, a first support element and a second support element. The first substrate has a first surface and a second surface opposite to the first surface. The second substrate is disposed over the first surface of the first substrate. The first support element is disposed between the first substrate and the second substrate. The first support element is disposed adjacent to an edge of the first surface of the first substrate. The second support element is disposed between the first substrate and the second substrate. The second support element is disposed far away from the edge of the first surface of the first substrate. The first support element and the second support element are without crack under a thermal cycling test carrying out at least 200 times.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
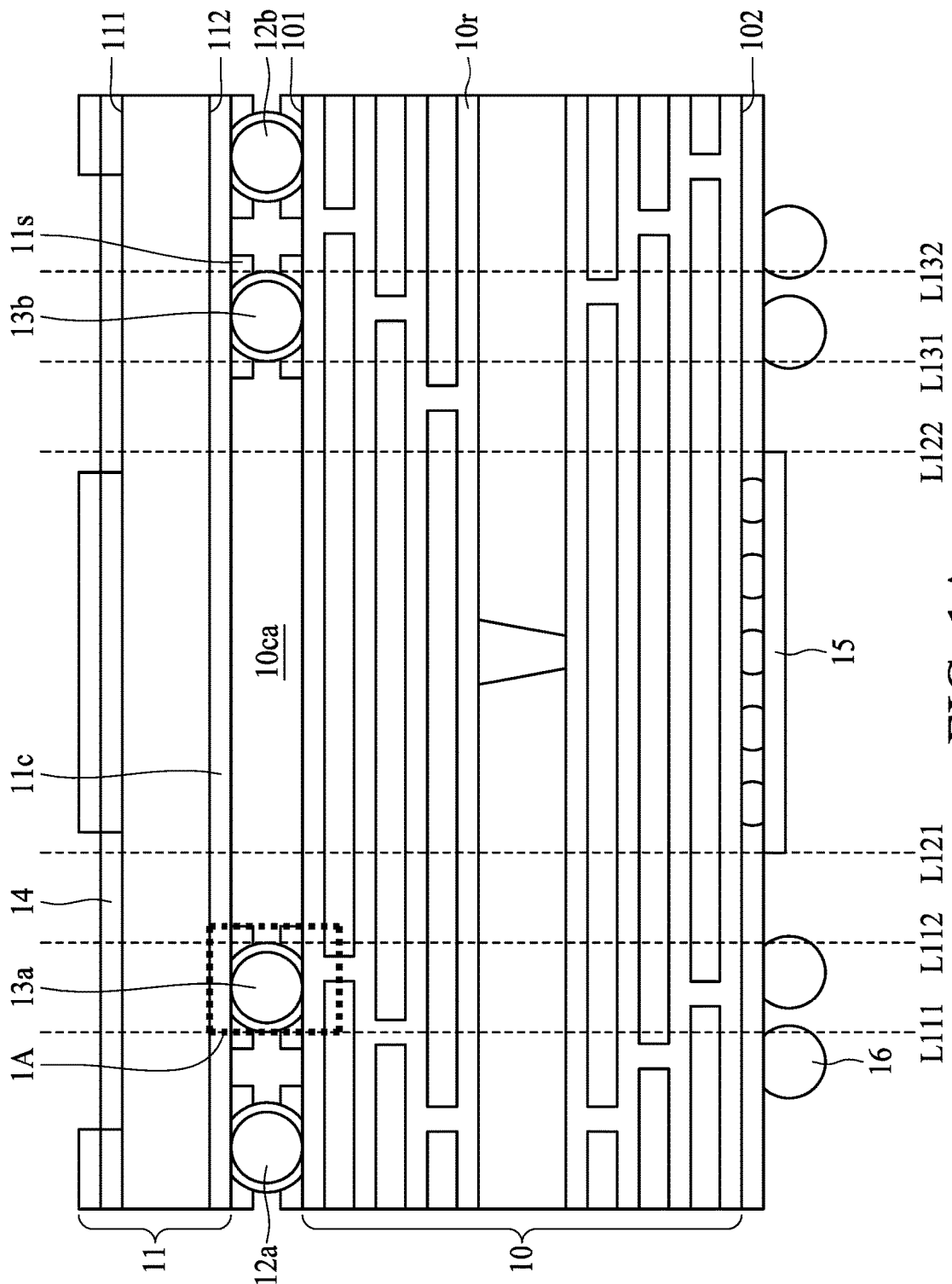
FIG. 1A illustrates a cross-sectional view of a semiconductor device package in accordance with some embodiments of the present disclosure.

FIG. 1A illustrates a cross-sectional view of a semiconductor device package 1 in accordance with some embodiments of the present disclosure. The semiconductor device package 1 includes substrates 10, 11, support elements 12a, 12b, 13a, 13b, an antenna pattern 14, an electronic component 15 and electrical contacts 16.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure 10r, such as a redistribution layer (RDL) or a grounding element. In some embodiments, the substrate 10 may be a single-layer substrate or multi-layer substrate which includes a core layer and a conductive material and/or structure disposed on a surface 101 (also can be referred to as a first surface) and a surface 102 (also can be referred to as a second surface) of the substrate 10. The conductive material and/or structure may include a plurality of traces.

Figure 1B:
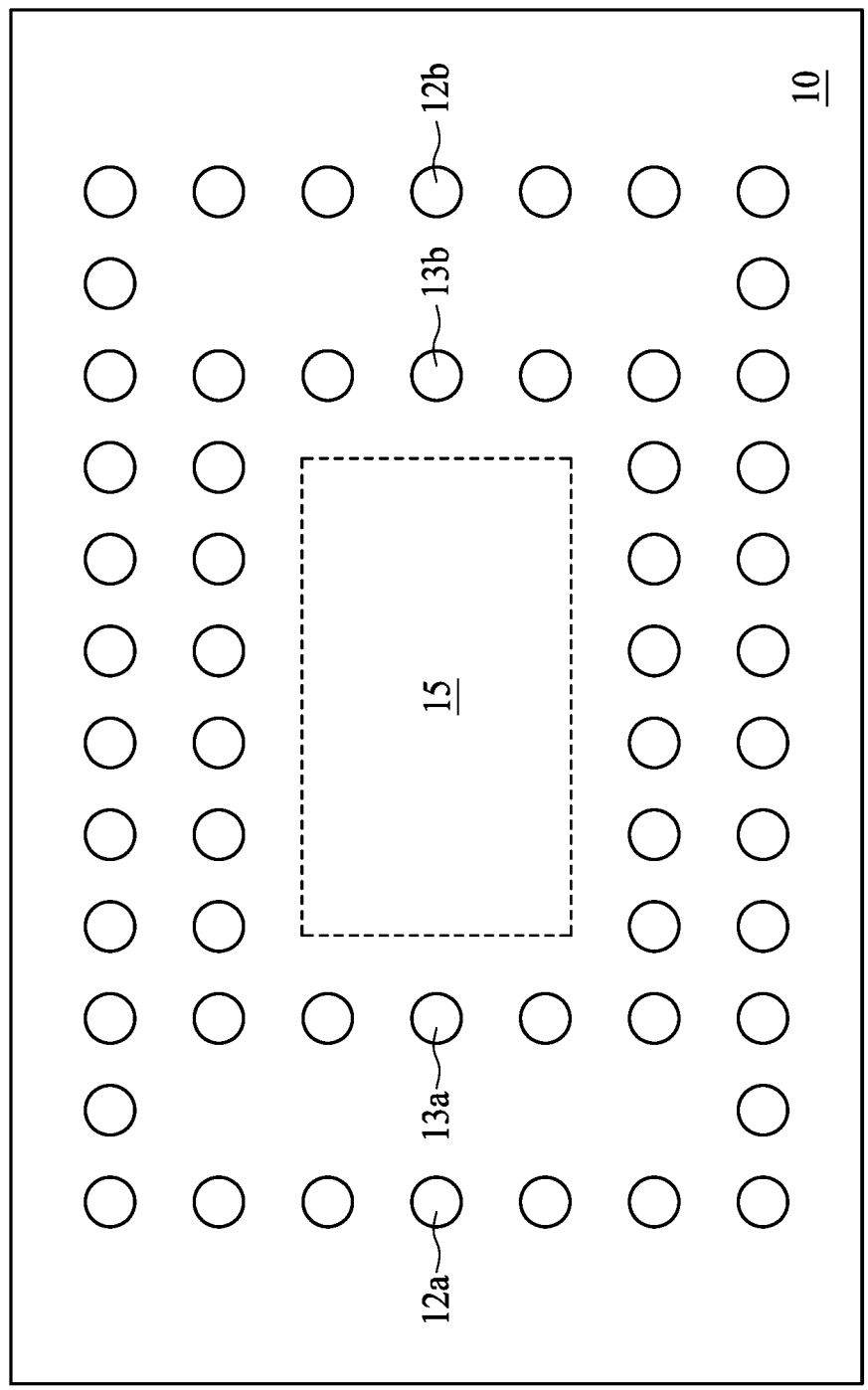
FIG. 1B illustrates a top view of the semiconductor device package shown in FIG. 1A in accordance with some embodiments of the present disclosure.
Figure 1C:
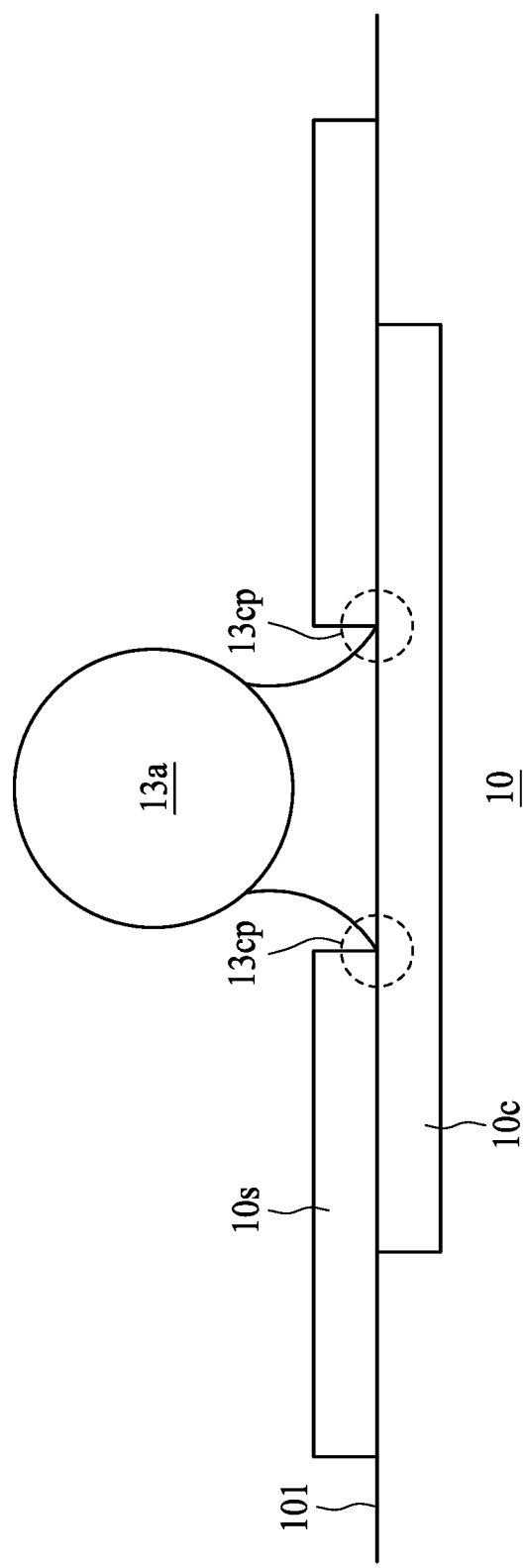
FIG. 1C illustrates an enlarged view of a portion of a support element shown in FIG. 1A in accordance with some embodiments of the present disclosure.

In some embodiments, as shown in FIG. 1C, which illustrates an enlarged view of a portion of the semiconductor device package 1 encircled by a dotted-line square 1A, the substrate 10 may include one or more conductive pads 10c in proximity to, adjacent to, or embedded in and exposed at the surface 101 of the substrate 10. The substrate 10 may include a solder resist 10s (or solder mask) on the surface 101 of the substrate 10 to fully expose or to expose at least a portion of the conductive pads 10c for electrical connections. For example, the solder resist 10s may cover a portion of the conductive pads 10c. In some embodiments, the conductive pads 10c are solder-mask defined (SMD) pads. In other embodiments, the conductive pads 10c may be non-solder-mask defined (NSMD) pads.

The electronic component 15 is disposed on the surface 102 of the substrate 10. The electronic component 15 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The electronic component 15 may be electrically connected to the substrate 10 (e.g., to the interconnection structure 10r), and electrical connection may be attained by way of flip-chip or wire-bond techniques. The electronic component 15 has an active surface facing the surface 102 of the substrate 10, a back surface opposite to the active surface and a lateral surface extending between the active surface and the back surface. In some embodiments, an underfill (not shown) may be disposed between the active surface of the electronic component 15 and the surface 102 of the substrate 10 to cover the active surface of the electronic component 15. In some embodiments, there may be any numbers of active components or passive components disposed on the surface 102 of the substrate 10 depending on different design specifications.

The electrical contacts 16 are disposed on the surface 102 of the substrate 10 to provide electrical connections between the semiconductor device package 1 and any other circuit boards (e.g., substrate, PCB, motherboard or the like) or circuits. In some embodiments, the electrical contacts 16 are solder balls or conductive pillars.

The substrate 11 is disposed over the substrate 10 and spaced apart from the substrate 10. For example, there is a gap between the substrate 10 and the substrate 11. In some embodiments, the substrate 11 can be the same as or different from the substrate 10 depending on design specifications. The substrate 11 has a surface 111 and a surface 112 opposite to the surface 111. The surface 112 of the substrate 11 faces the surface 101 of the substrate 10. In some embodiments, the surface 101 of the substrate 10 is parallel to the surface 112 of the substrate 11. The substrate 11 may include one or more conductive pads 11c in proximity to, adjacent to, or embedded in and exposed at the surface 112 of the substrate 11. The substrate 11 may include a solder resist 11s (or solder mask) on the surface 112 of the substrate 11 to expose at least a portion of the conductive pads 11c for electrical connections.

The antenna pattern 14 is disposed on the surface 111 of the substrate 11. In some embodiments, the antenna pattern 14 includes a plurality of antenna elements. For example, the antenna pattern 14 may include an array of antenna elements. In some embodiments, the antenna pattern 14 may include an M×N array of antenna elements, where M and N are integers equal to or greater than 1.

The support elements 12a, 12b, 13a and 13b are disposed between the substrate 10 and the substrate 11 to define a cavity 10ca (or air cavity) therebetween. In some embodiments, the support elements 12a, 12b, 13a and 13b may be disposed on conductive pads 10c and 11c. In some embodiments, the support elements 12a and 12b are disposed adjacent to or close to edges of the surface 101 of the substrate 10. For example, as shown in FIG. 1B, which illustrates a top view of the semiconductor device package 1 in FIG. 1A (for clarity, some of the components are omitted), the support elements 12a and 12b may disposed along the edges of the surface 101 of the substrate 10. In some embodiments, the support elements 13a and 13b are disposed far away from the edges of the surface 101 of the substrate 10. For example, as shown in FIG. 1B, the support elements 13a and 13b are disposed at an inner side of the support elements 12a and 12b. In some embodiments, the support elements 13a and 13b may be surrounded by the support elements 12a and 12b. As shown in FIG. 1B, the support elements 13a and 13b may surround the electronic component 15.

In some embodiments, a projection (e.g., the projection lines L111 and L112 or the projection lines L131 and L132) of the support element 13a or 13b on the surface 102 of the substrate 10 does not overlap a projection (e.g., the projection lines L121 and L122) of the electronic component 15 on the surface 102 of the substrate 10. For example, the projection of the support element 13a or 13b on the surface 102 of the substrate 10 is horizontally spaced apart from the projection of the lateral surface of the electronic component 15 on the surface 102 of the substrate 10. For example, the projection of the support element 13a or 13b on the surface 102 of the substrate 10 is not within the projection of the electronic component 15 on the surface 102 of the substrate 10. As shown in FIG. 1C, in some embodiments, the projection of a contact point 13cp (as shown in FIG. 1C) between the support element 13a, the solder resist 10cp and the conductive pad 10c on the surface 102 of the substrate 10 is horizontally spaced apart from the projection of the lateral surface of the electronic component 15 on the surface 102 of the substrate 10. For example, the projection of a contact point 13cp (as shown in FIG. 1C) between the support element 13a, the solder resist 10cp and the conductive pad 10c on the surface 102 of the substrate 10 is not within the projection of the electronic component 15 on the surface 102 of the substrate 10.

In some embodiments, the support elements 12a, 12b, 13a and 13b are formed of the same material. In some embodiments, the support elements 12a, 12b, 13a and 13b may be or include plastic core balls. By using the plastic core balls as the support elements, the distance between the substrates 10 and 11 can be precisely controlled, which would increase radiation efficiency of the antenna pattern 14. In some embodiments, the support elements 12a, 12b, 13a and 13b may be or include metal core balls. For example, the metal core ball may include a core, an inner layer covering the core and an outer layer covering the inner layer. In some embodiments, the core is formed of or includes copper (Cu), the inner layer is formed of or includes nickel (Ni) and the outer layer is formed of or includes tin (Sn). In some embodiments, the support elements 12a, 12b, 13a and 13b formed of metal core balls can be used for signal transmission (e.g., feeding signal for the antenna pattern 14).

In some embodiments, the material of the support elements 12a and 12b adjacent to the edges of the surface 101 of the substrate 10 are different from the material of the support elements 13a and 13b surrounded by the support elements 12a and 12b. In some embodiments, the hardness of the material of the support elements 13a and 13b is greater than that of the support elements 12a and 12b, which can resist the stress and prevent the support elements 12a and 12b from being cracked. In some embodiments, the support elements 13a and 13b may include the metal core balls, and the support elements 12a and 12b may include solder balls, the plastic core ball, thermosetting material (e.g., epoxy), B-stage adhesive (or cured B-stage adhesive). In some embodiments, the support elements 13a and 13b may include the plastic core balls, and the support elements 12a and 12b may include solder balls, thermosetting material (e.g., epoxy), B-stage adhesive (or cured B-stage adhesive).

In the embodiments in FIGS. 1A-1C, the projection of the support element 13a or 13b on the surface 102 of the substrate 10 (or the projection of a contact point 13cp between the support element 13a, the solder resist 10cp and the conductive pad 10c on the surface 102 of the substrate 10) is horizontally spaced apart from the projection of the lateral surface of the electronic component 15 on the surface 102 of the substrate 10. Therefore, the maximum stress at the lateral surface of the electronic component 15 would not directly apply to the support elements 13a and 13b, which can avoid the crack or voids occurring on the support elements 13a and 13b. In some embodiments, the support elements 12a, 12b, 13a and 13b are without crack or avoids under a thermal cycling test or a temperature cycling test (e.g., JEDEC standard) carrying out at least 200 times, for example, more than 500 times or more than 1000 times.

Figure 2:
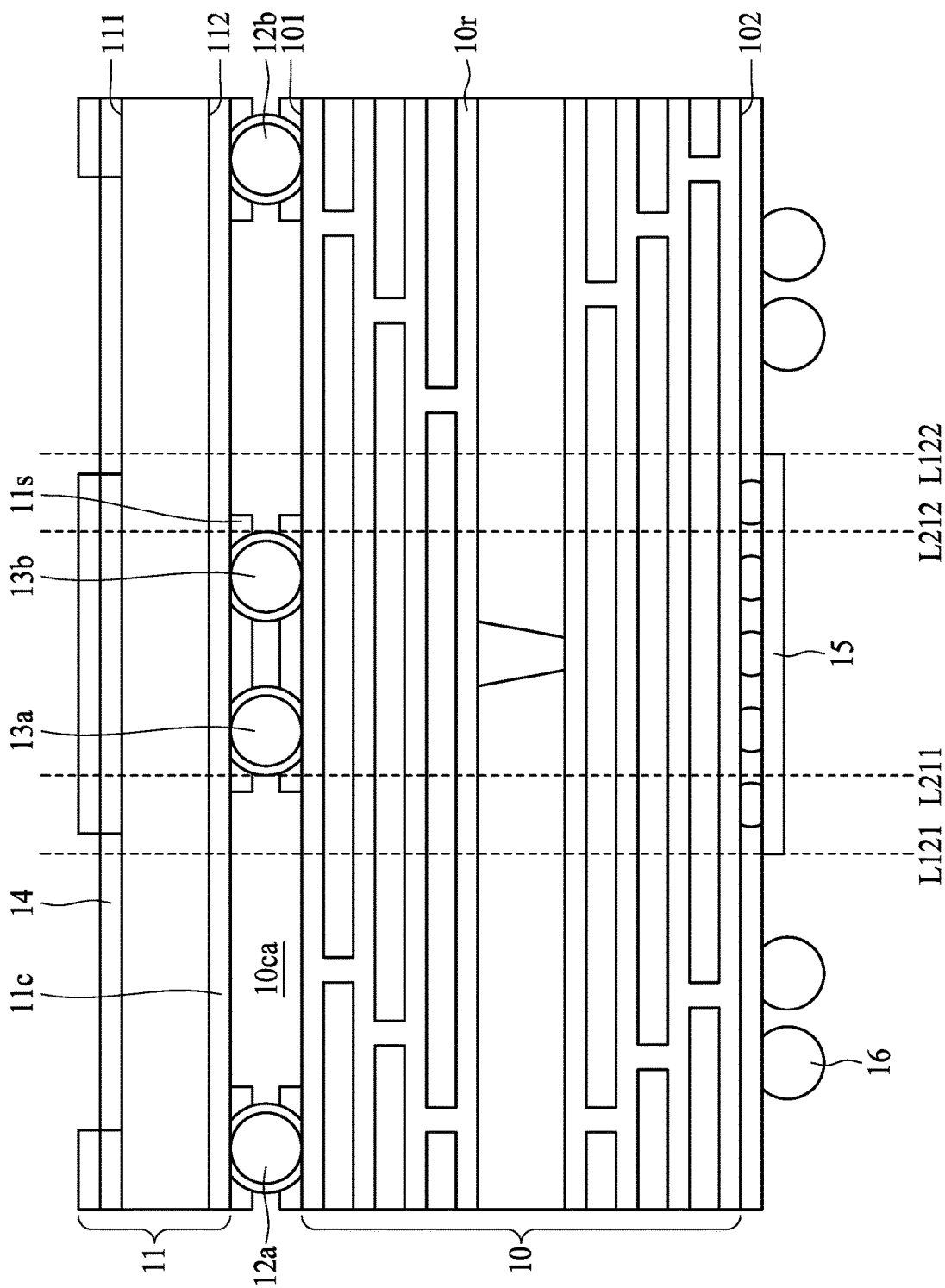
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1A, and the difference therebetween are described below.

As shown in FIG. 2, a projection (e.g., the projection lines L211 and L212) of the support element 13a and 13b on the surface 102 of the substrate 10 is within a projection (e.g., the projection lines L121 and L122) of the electronic component 15 on the surface 102 of the substrate 10, but the projection of the support elements 13a and 13b does not overlap the projection of the lateral surface of the electronic component 15 on the surface 102 of the substrate 10. For example, a distance between the projection lines L211 and L212 is less than a distance between the projection lines L121 and L122. Therefore, the maximum stress at the lateral surface of the electronic component 15 would not directly apply to the support elements 13a and 13b, which can avoid the crack or voids occurring on the support elements 13a and 13b. In some embodiments, the support elements 12a, 12b, 13a and 13b are without crack or avoids under a thermal cycling test or a temperature cycling test (e.g., JEDEC standard) carrying out at least 200 times, for example, more than 500 times or more than 1000 times.

FIG. 3A, FIG. 3B, FIG. 3C, FIG. 3D and FIG. 3E are cross-sectional views of a semiconductor structure at various stages of fabrication, in accordance with some embodiments of the present disclosure. Various figures have been simplified to provide a better understanding of the aspects of the present disclosure.

Figure 3A:
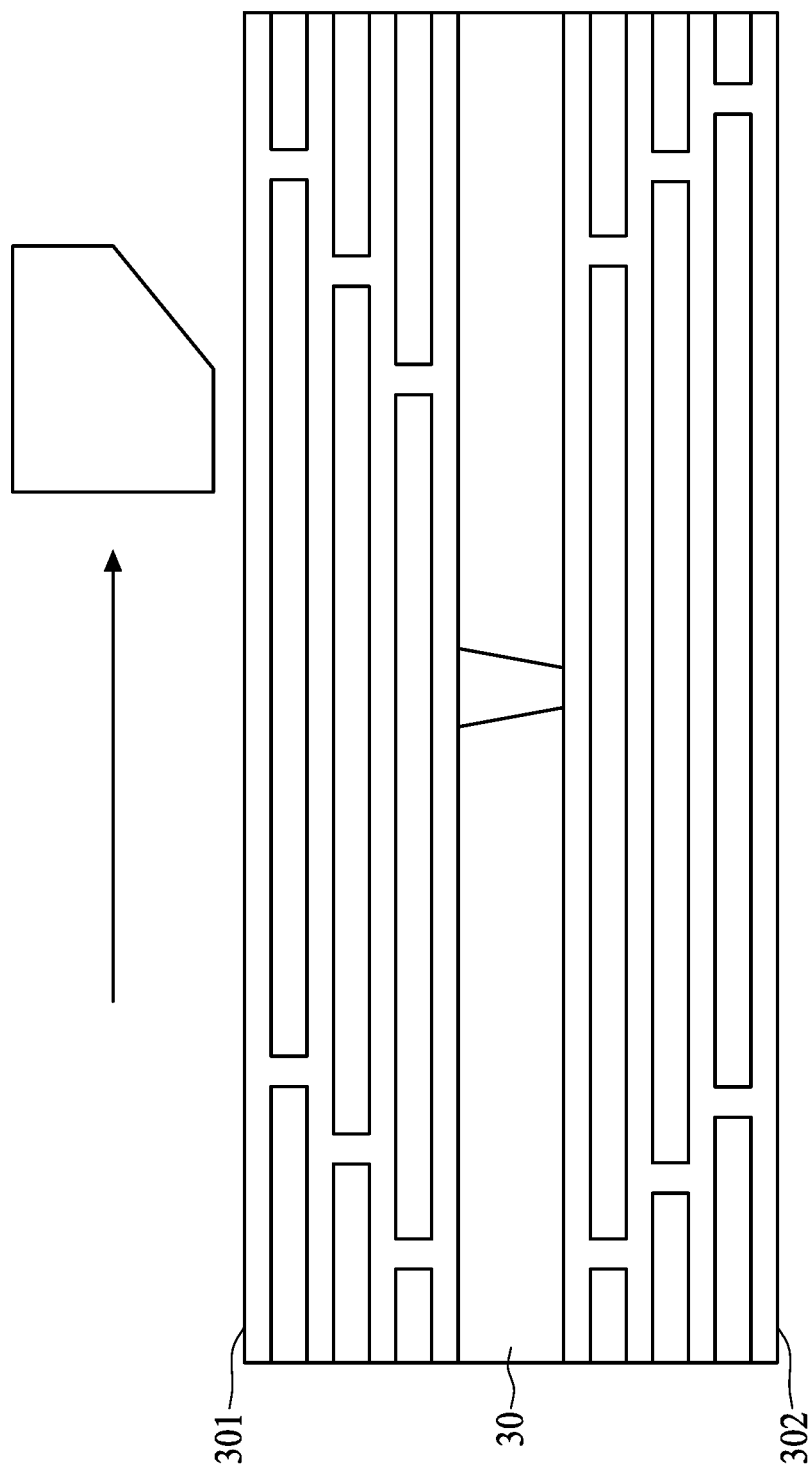
FIG. 3A, FIG. 3B, FIG. 3C, FIG. 3D and FIG. 3E illustrate a method of manufacturing a semiconductor device package in accordance with some embodiments of the present disclosure.

Referring to FIG. 3A, a substrate 30 is provided. In some embodiments, the substrate 30 is similar to the substrate 10 in FIG. 1A, and the structure or properties of the substrate 30 are similar to the substrate 10. The substrate 30 includes a surface 301 and a surface 302 opposite to the surface 301. A solder printing is carried out on the surface 301 of the substrate 30. In some embodiments, the solder printing may be carried out on both surfaces 301 and 302 of the substrate 30.

Figure 3B:
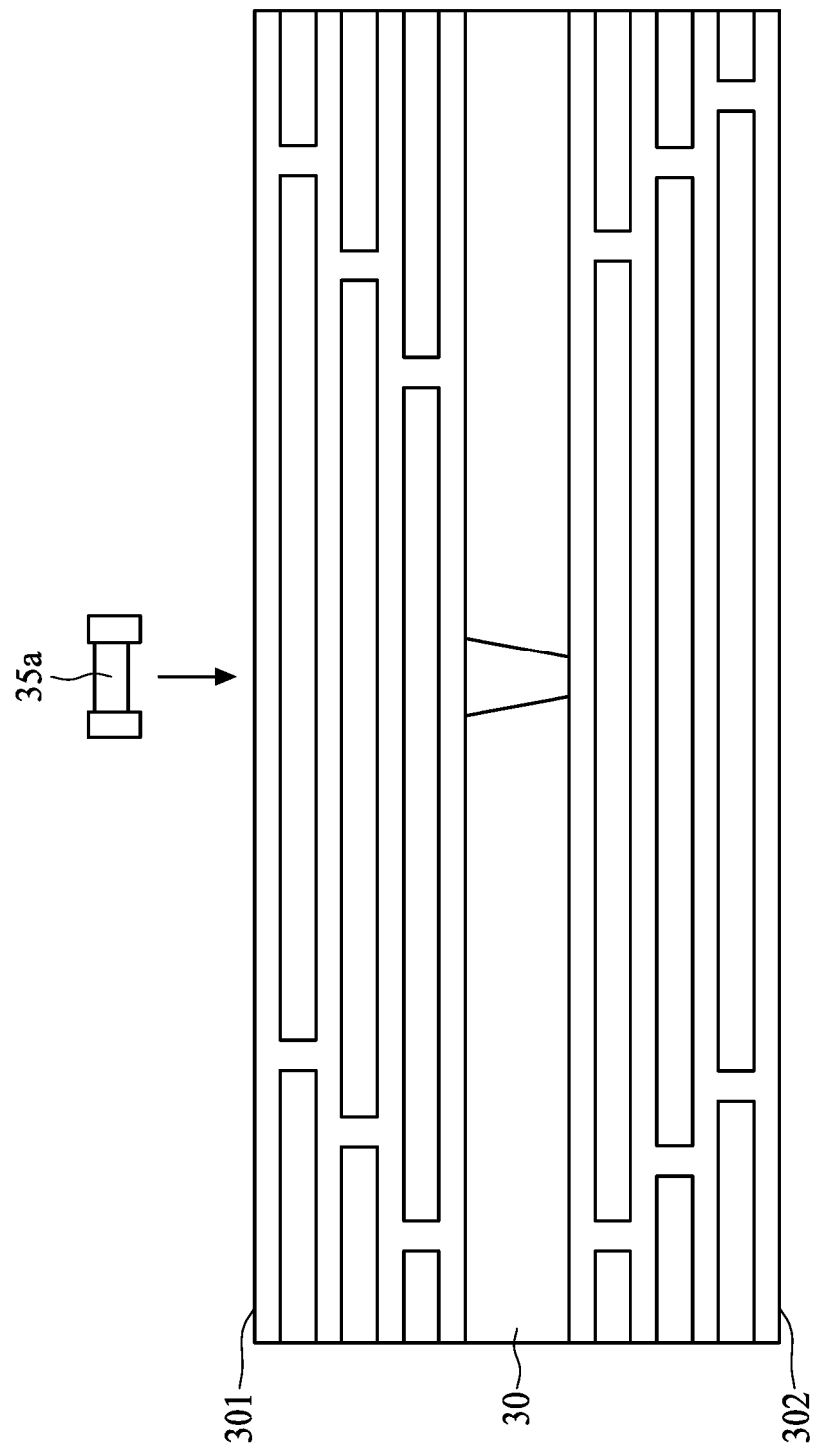
Figure 3C:
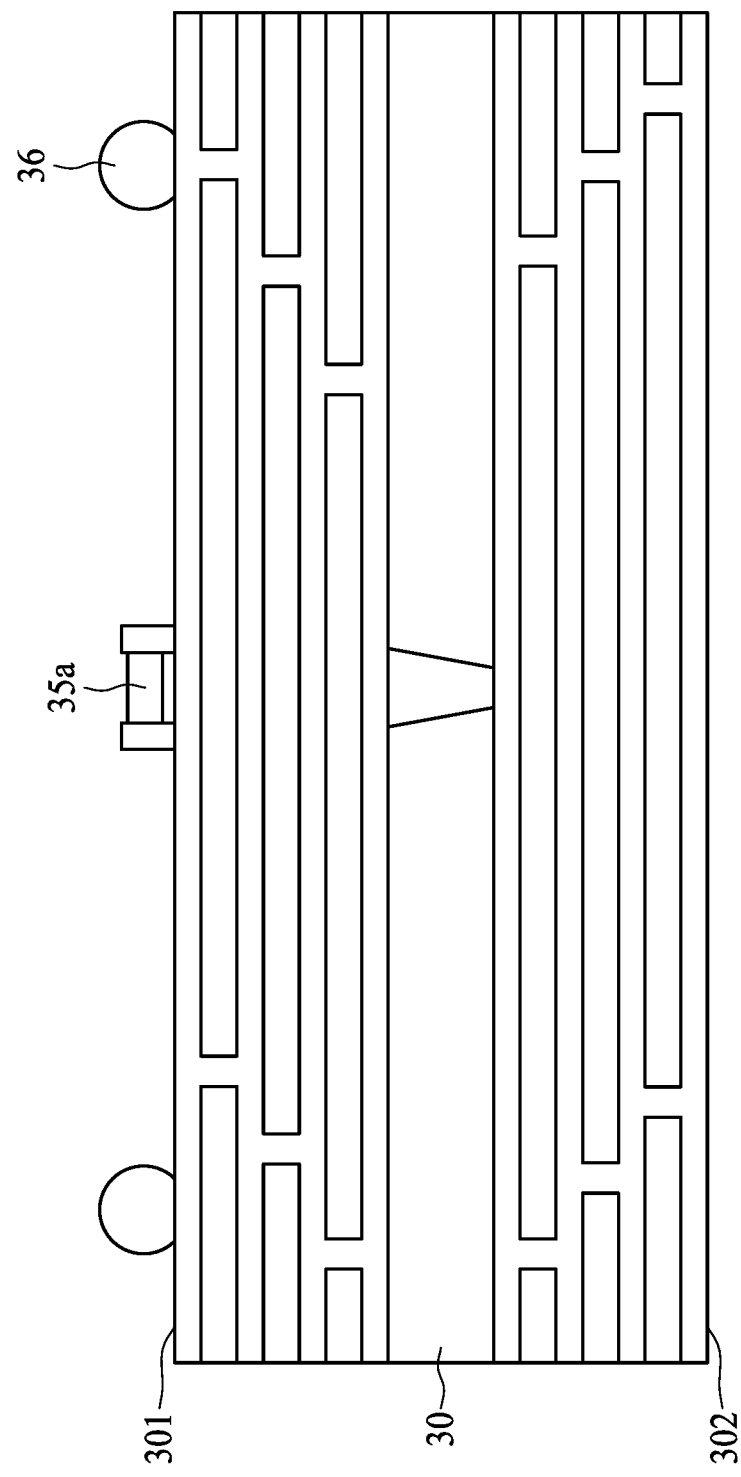
Figure 3D:
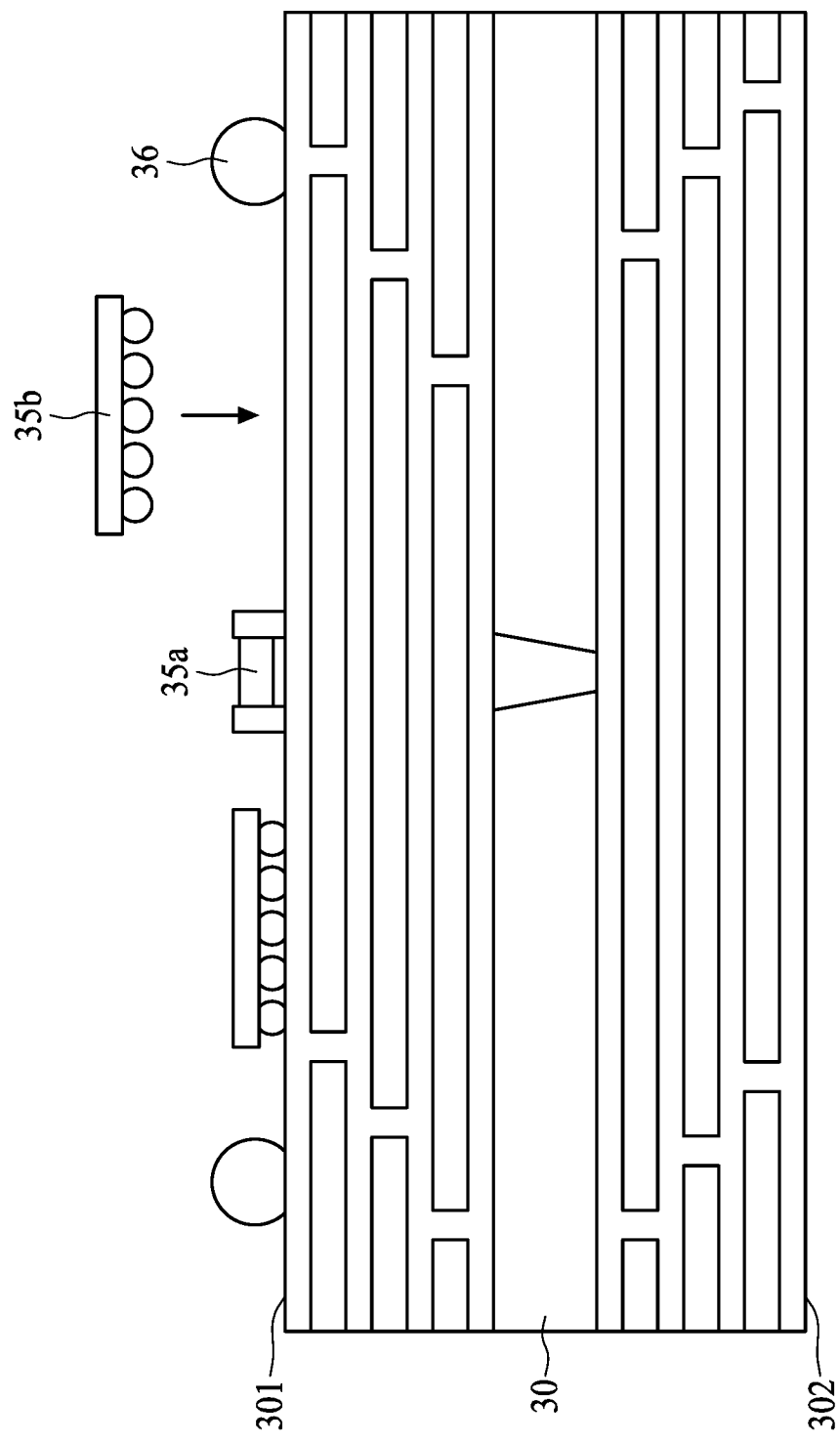

Referring to FIGS. 3B, 3C and 3D, passive components 35a, solder balls 36 and active components 35b are disposed on the surface 301 of the substrate 30. In some embodiments, the passive components 35a and the solder balls 36 may be placed on the surface 301 of the substrate 30 by surface mount technology (SMT) or any other suitable processes. In some embodiments, the active component 35b is placed on the surface 301 of the substrate 30 by flip-chip or any other suitable processes. In some embodiments, the order for disposing the passive components 35a, the solder balls 36 and the active components 35b can be adjusted or changed depending on different design specifications. Then, a reflow process may be carried out for the passive components 35a, the solder balls 36 and the active components 35b.

Figure 3E:
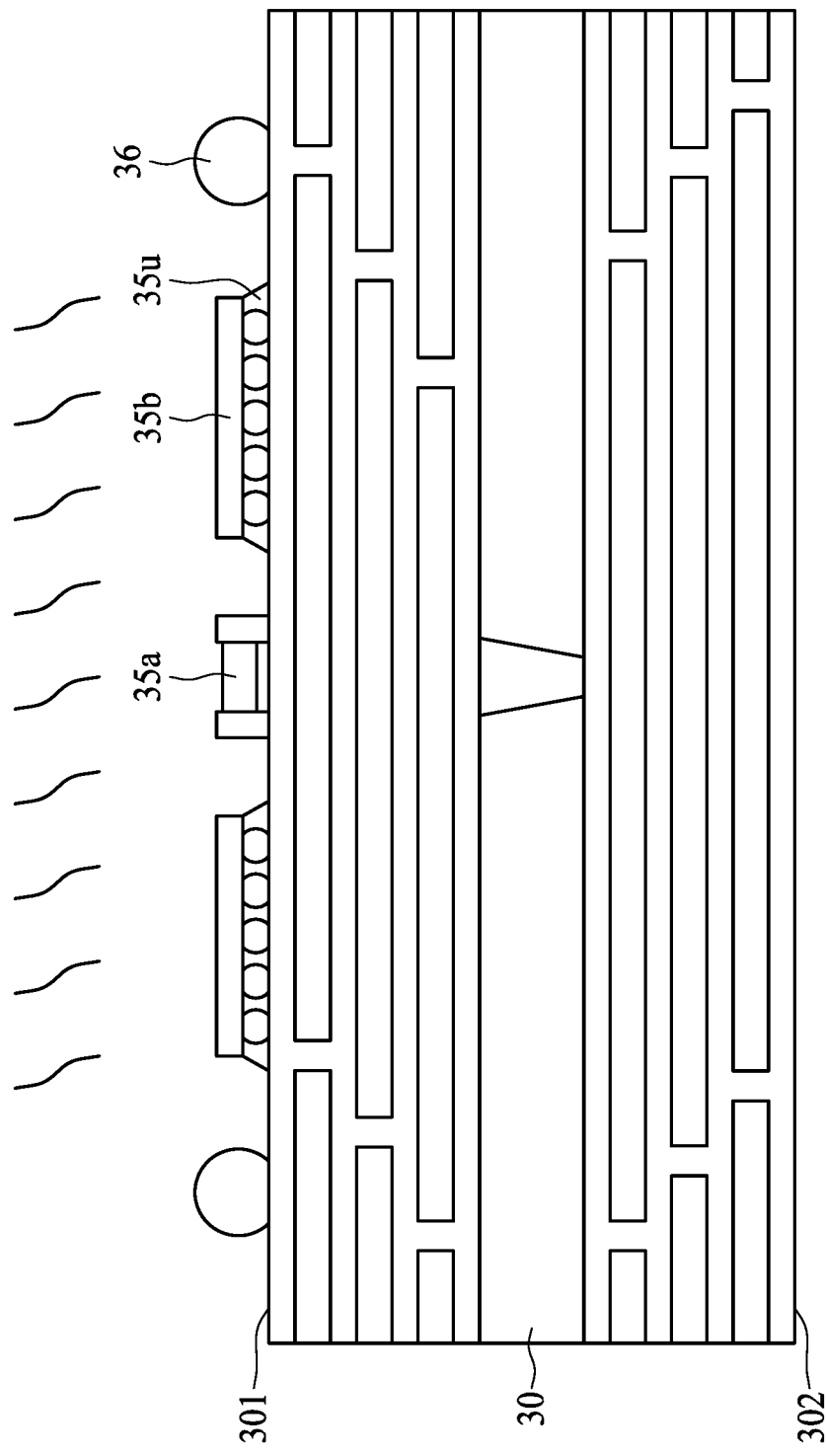

Referring to FIG. 3E, an underfill 35u is formed between an active surface of each of the active components 35b and the surface 301 of the substrate 30 to protect the active surfaces of the active components 35b. Then, a reflow process may be carried out for the underfill 35u to cure the underfill 35u.

Figure 4A:
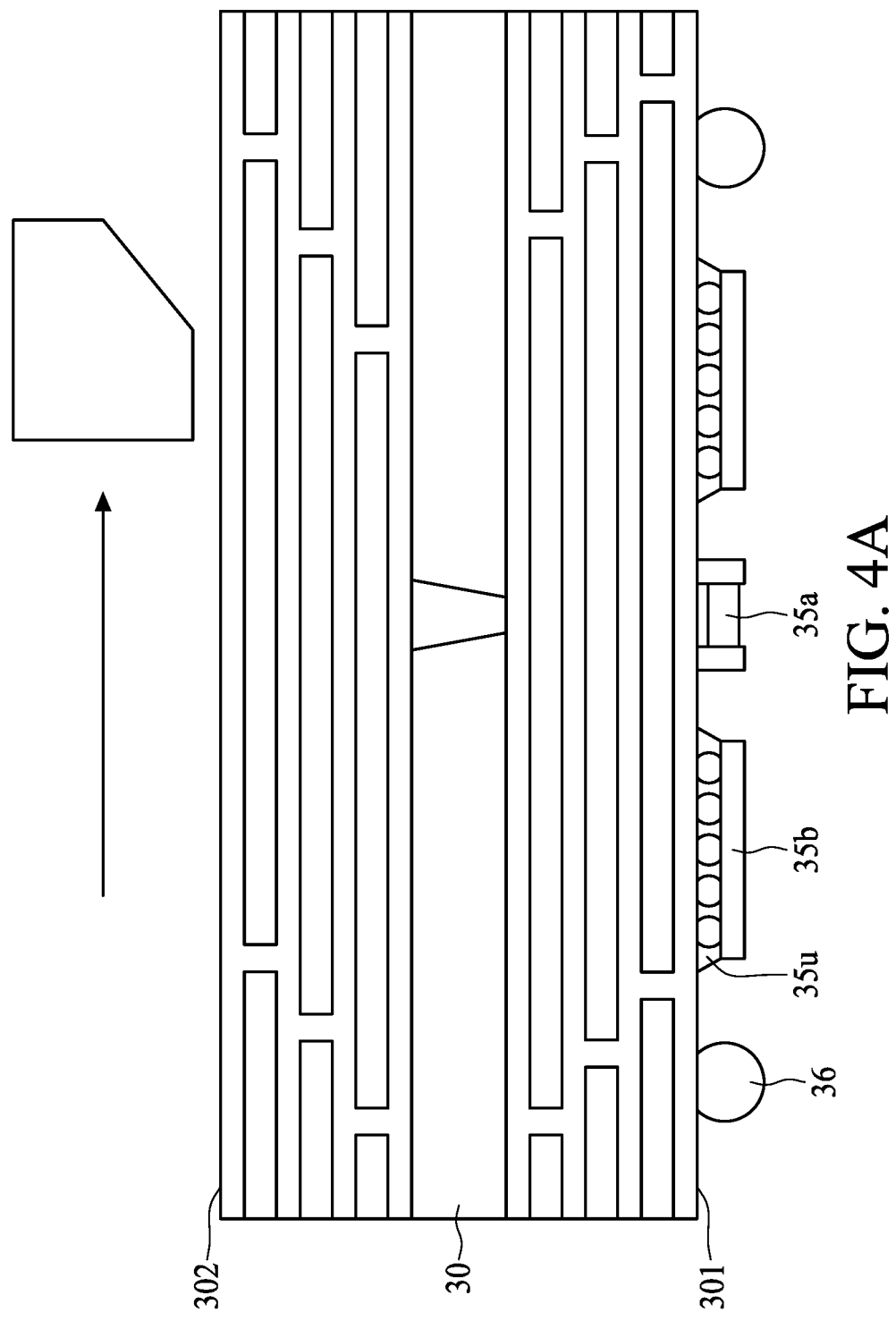
FIG. 4A, FIG. 4B and FIG. 4C illustrate a method of manufacturing a semiconductor device package in accordance with some embodiments of the present disclosure.
Figure 4B:
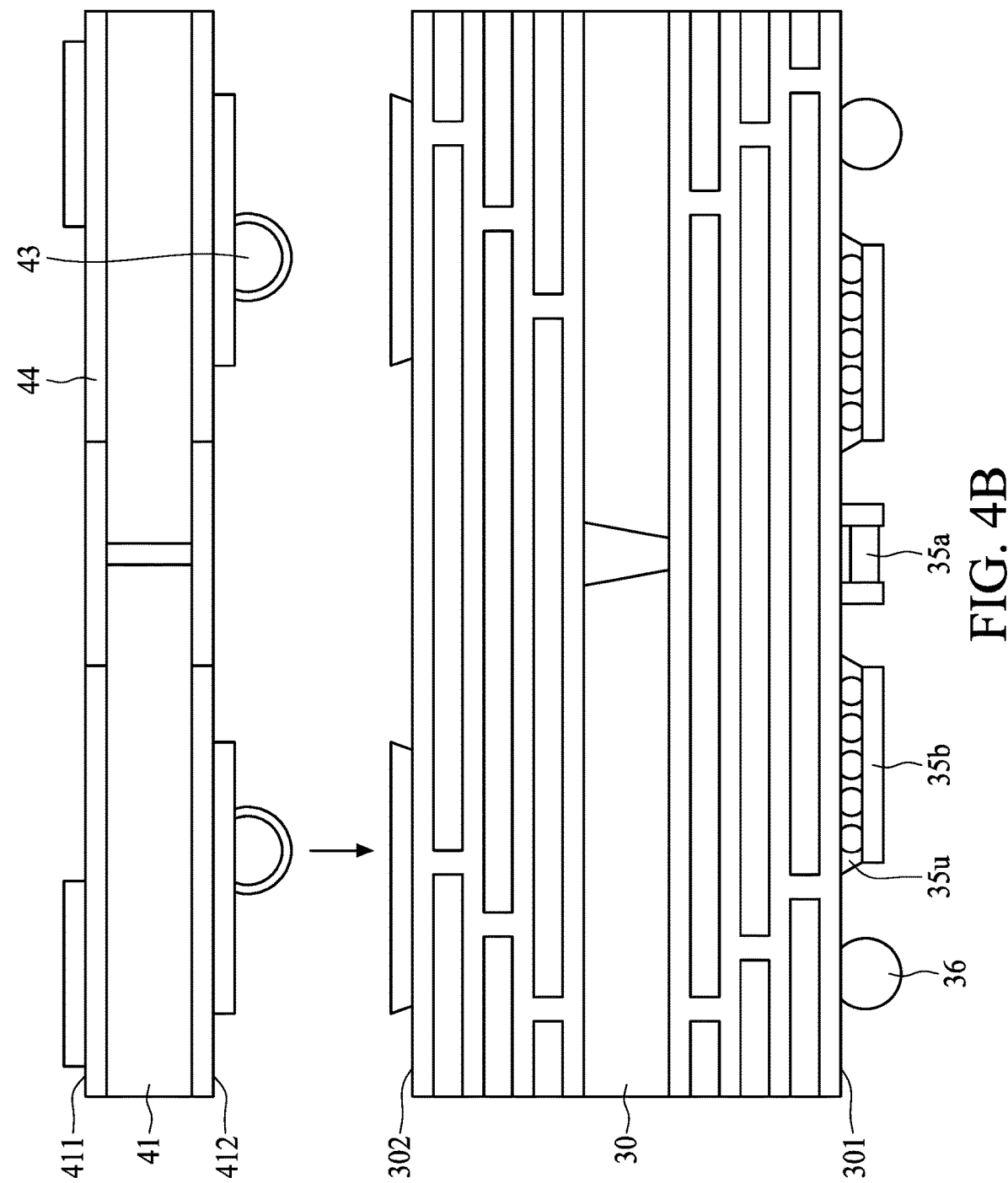
Figure 4C:
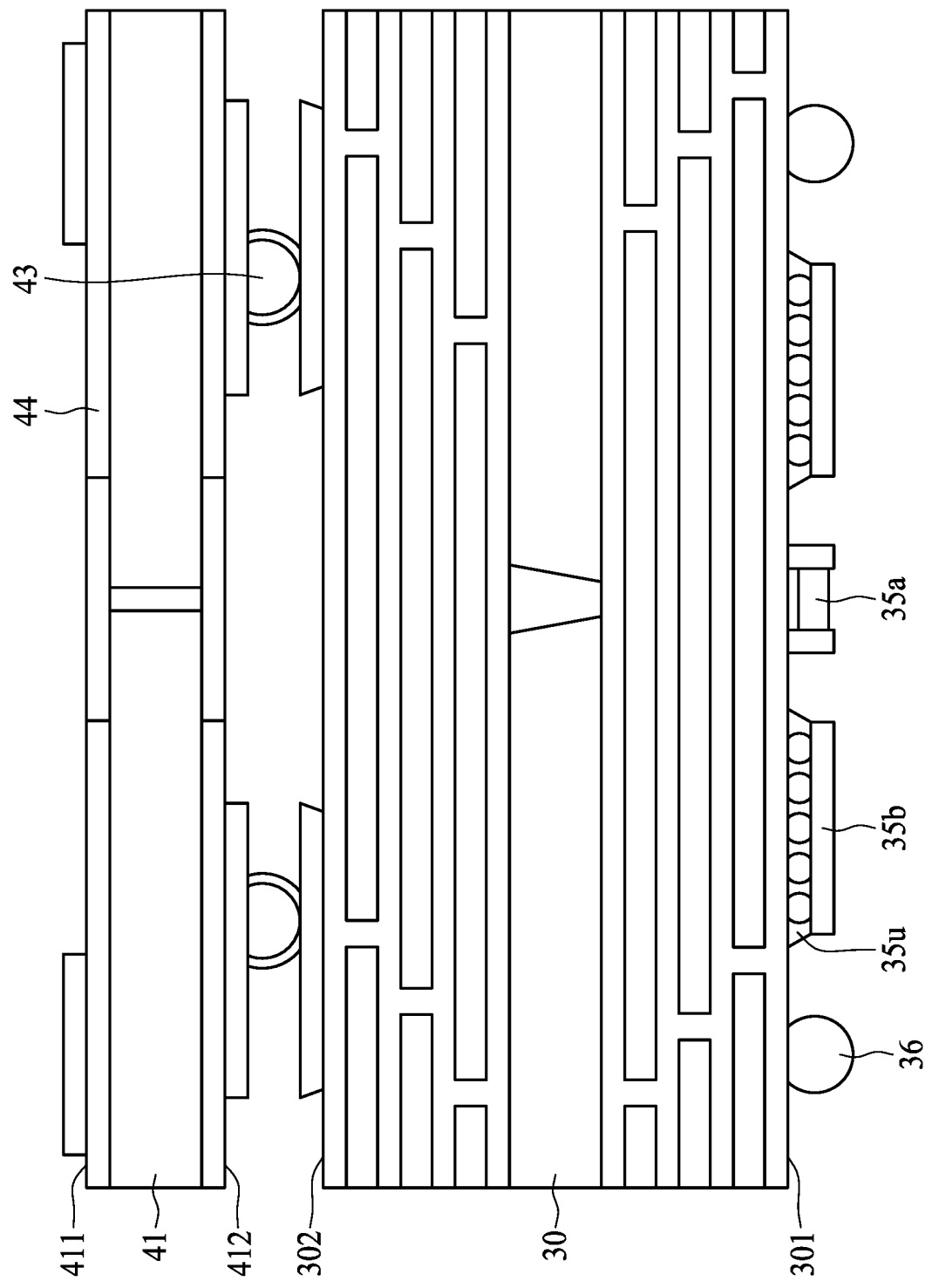

FIG. 4A, FIG. 4B and FIG. 4C are cross-sectional views of a semiconductor structure at various stages of fabrication, in accordance with some embodiments of the present disclosure. Various figures have been simplified to provide a better understanding of the aspects of the present disclosure.

Referring to FIG. 4A, the structure illustrated in FIG. 3E is provided. A solder printing process is carried out on the surface 302 of the substrate 30.

Referring to FIG. 4B, a substrate 41 is provided. In some embodiments, the substrate 41 is similar to the substrate 11 in FIG. 1A, and the structure or properties of the substrate 41 are similar to the substrate 11. The substrate 41 includes a surface 411 and a surface 412 opposite to the surface 411. The substrate 41 may include an antenna pattern 44 on the surface 411 of the substrate 41. In some embodiments, the antenna pattern 44 is similar to the antenna pattern 14 in FIG. 1A.

A plurality of support elements 43 are disposed on the surface 412 of the substrate 41 by, for example, SMT or any other suitable processes. In some embodiments, the support elements 43 are similar to the support elements 12a, 12b, and/or the support elements 13a and 13c. Therefore, the structure, the locations and the properties of the support elements 12a, 12b, and/or the support elements 13a and 13c can be applicable to the support elements 43.

Still referring to FIG. 4B, the substrate 41 is placed on the surface 302 of the substrate 30 with the support elements 43 connected to the surface 302 of the substrate 30. In some embodiments, the substrate 41 can be connected to the substrate 30 by, for example, pick and place or any other suitable processes. Referring to FIG. 4C, a reflow process is than carried out on the structure illustrated in FIG. 4B.

As used herein, the terms "approximately," "substantially," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a first substrate having a first surface and a second surface opposite to the first surface, the first substrate having a conductive pad adjacent to the first surface of the first substrate;
   a second substrate disposed over the first surface of the first substrate;
   a first support element disposed between the first substrate and the second substrate, the first support element disposed adjacent to an edge of the first surface of the first substrate;
   a second support element disposed between the first substrate and the second substrate, the second support element disposed far away from the edge of the first surface of the first substrate; and
   an electronic component disposed on the second surface of the first substrate, wherein the first support element and the second support element are formed of different materials.

2. The semiconductor device package of claim 1, wherein the first substrate further comprises a solder resist disposed on the first surface of the first substrate and exposing at least a portion of the conductive pad.

3. The semiconductor device package of claim 2, wherein the solder resist and the conductive pad define a recess; and
   a portion of the second support element is disposed within the recess.

4. The semiconductor device package of claim 2, wherein the contact point is between the second support element, the conductive pad and the solder resist.

5. The semiconductor device package of claim 1, wherein each of the first support element and the second support element includes a plastic core ball.

6. The semiconductor device package of claim 1, wherein each of the first support element and the second support element includes a core, an inner layer covering the core and an outer layer covering the inner layer.

7. The semiconductor device package of claim 6, wherein the core is formed of copper, the inner layer is formed of nickel, and the outer layer is formed of tin.

8. The semiconductor device package of claim 1, wherein a hardness of the second support element is greater than a hardness of the first support element.

9. The semiconductor device package of claim 1, wherein the second support element includes a plastic core ball, and the first support element includes a solder ball.

10. The semiconductor device package of claim 1, wherein the second support element includes a copper core ball, and the first support element includes a solder ball or a plastic core ball.

11. The semiconductor device package of claim 1, further comprising an antenna pattern disposed on a first surface of the second substrate facing away from the first substrate.

12. The semiconductor device package of claim 1, wherein the second support element is between the electronic component and the first support element from a top view perspective.

13. The semiconductor device package of claim 1, wherein the electronic component has a second lateral surface opposite the first lateral surface, and the second support element is located within the projection line of the first lateral surface of the electronic component on the second surface of the first substrate and a projection line of the second lateral surface of the electronic component on the second surface of the first substrate.

14. The semiconductor device package of claim 1, further comprising a plurality of the first support elements and a plurality of the second support elements, wherein the second support elements are surrounded by the first support elements.

15. The semiconductor device package of claim 1, wherein the second support element and the electronic component overlap from a top view perspective.

16. A semiconductor device package, comprising:
   a first substrate having a first surface and a second surface opposite to the first surface;

a second substrate disposed over the first surface of the first substrate;

a first support element disposed between the first substrate and the second substrate, the first support element disposed adjacent to an edge of the first surface of the first substrate; and a second support element disposed between the first substrate and the second substrate, the second support element disposed far away from the edge of the first surface of the first substrate, wherein the first support element and the second support element are devoid of crack under a thermal cycling test carried out at least 200 times.

17. The semiconductor device package of claim 16, wherein each of the first support element and the second support element includes a plastic core ball.

18. The semiconductor device package of claim 16, wherein each of the first support element and the second support element includes a core, an inner layer covering the core and an outer layer covering the inner layer.

19. The semiconductor device package of claim 18, wherein the core is formed of copper, the inner layer is formed of nickel, and the outer layer is formed of tin.

20. The semiconductor device package of claim 16, further comprising an antenna pattern disposed on a first surface of the second substrate facing away from the first substrate.

21. The semiconductor device package of claim 16, further comprising an electronic component disposed on the second surface of the first substrate.

22. The semiconductor device package of claim 21, wherein the first substrate further comprises:

a conductive pad disposed adjacent to the first surface of the first substrate; and a solder resist disposed on the first surface of the first substrate and exposing at least a portion of the conductive pad.

23. The semiconductor device package of claim 22, wherein a projection line of a contact point between the second support element, the solder resist and the conductive pad on the second surface of the first substrate is physically spaced apart from a projection line of a lateral surface of the electronic component on the second surface of the first substrate.

24. The semiconductor device package of claim 21, wherein the electronic component has an active surface facing the second surface of the first substrate and a lateral surface substantially perpendicular to the active surface; and a projection of the second support element on the second surface of the first substrate is horizontally spaced apart from a projection of the lateral surface of the electronic component on the second surface of the first substrate.

25. A semiconductor device package, comprising:

a first substrate having a first surface and a second surface opposite to the first surface, the first substrate having a conductive pad adjacent to the first surface of the first substrate;

a second substrate disposed over the first surface of the first substrate;

a first support element disposed between the first substrate and the second substrate, the first support element disposed adjacent to an edge of the first surface of the first substrate;

a second support element disposed between the first substrate and the second substrate, the second support element disposed far away from the edge of the first surface of the first substrate, wherein the first support element and the second support element are formed of different materials; and an electronic component disposed on the second surface of the first substrate, wherein a projection line of a contact point between the second support element and the conductive pad on the second surface of the first substrate is physically spaced apart from a projection line of a first lateral surface of the electronic component on the second surface of the first substrate.

26. The semiconductor device package of claim 25, wherein the second support element is between the electronic component and the first support element from a top view perspective.

27. The semiconductor device package of claim 25, further comprising a plurality of the first support elements and a plurality of the second support elements, wherein the second support elements are surrounded by the first support elements.

28. The semiconductor device package of claim 25, wherein the electronic component has a second lateral surface opposite the first lateral surface, and the second support element is located within the projection line of the first lateral surface of the electronic component on the second surface of the first substrate and a projection line of the second lateral surface of the electronic component on the second surface of the first substrate.

29. The semiconductor device package of claim 25, further comprising an antenna pattern disposed on a first surface of the second substrate facing away from the first substrate.

30. The semiconductor device package of claim 25, wherein the first support element is formed of a non-conductive material.

31. The semiconductor device package of claim 30, wherein the second support element is formed of a conductive material.

32. The semiconductor device package of claim 25, wherein the second support element is formed of a non-conductive material.

\* \* \* \* \*